US007001831B2

(12) United States Patent
Niira et al.

(10) Patent No.: US 7,001,831 B2
(45) Date of Patent: Feb. 21, 2006

(54) METHOD FOR DEPOSITING A FILM ON A SUBSTRATE USING CAT-PACVD

(75) Inventors: Koichiro Niira, Yokaichi (JP); Hirofumi Senta, Yokaichi (JP); Hideki Hakuma, Yokaichi (JP); Hiroki Okui, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 181 days.

(21) Appl. No.: 10/371,217

(22) Filed: Feb. 20, 2003

(65) Prior Publication Data

US 2003/0176011 A1 Sep. 18, 2003

(30) Foreign Application Priority Data

Mar. 12, 2002 (JP) ............................... 2002-67445

(51) Int. Cl.
*H01L 21/20* (2006.01)
*H01L 21/36* (2006.01)

(52) U.S. Cl. ....................... 438/485; 438/482; 438/488

(58) Field of Classification Search ................ 438/482, 438/485, 488, 489, 491
See application file for complete search history.

(56) References Cited

U.S. PATENT DOCUMENTS

| | | | | |
|---|---|---|---|---|
| 5,122,431 A * | 6/1992 | Kodama et al. | ............ | 430/128 |
| 5,980,999 A * | 11/1999 | Goto et al. | ................. | 427/572 |
| 6,472,297 B1 * | 10/2002 | Ogawa et al. | ............. | 438/488 |

FOREIGN PATENT DOCUMENTS

| | | |
|---|---|---|
| JP | 61-026772 | 2/1986 |
| JP | 61-026775 | 2/1986 |
| JP | 61-57778 | 3/1986 |
| JP | 61-247018 | 11/1986 |
| JP | 03-239320 | 10/1991 |
| JP | 07-176399 | 7/1995 |
| JP | 09-137274 | 5/1997 |
| JP | 10-104862 | 4/1998 |
| JP | 10-310867 | 11/1998 |
| JP | 11-054441 | 2/1999 |
| JP | 2000-114256 | 4/2000 |
| JP | 2000-323421 | 11/2000 |
| JP | 2000-331942 | 11/2000 |

(Continued)

OTHER PUBLICATIONS

Ferreira, et al., "A Comparison Study of Nanocrystalline Undoped Silicon Films Produced By Hot Wire and Hot Wire Plasma Assisted Technique" 16th European Photovoltaic Solar Energy Conference, May 1-5, 2000, Glasgow, UK, pp. 421-424.

(Continued)

*Primary Examiner*—Amir Zarabian
*Assistant Examiner*—Khanh Duong
(74) *Attorney, Agent, or Firm*—Hogan & Hartson, LLP

(57) ABSTRACT

A non-Si non-C-based gas is heated by a thermal catalysis body provided in a gas introduction channel, and the heated non-Si non-C-based gas and a material-based gas comprising Si and/or C are separately introduced into a film deposition space through a showerhead having a plurality of gas effusion ports, and in the film deposition space, a plasma space is formed by a nonplanar electrode connected to a radio frequency power supply, thereby forming a film on a substrate. Formation of high-quality Si-based films and C-based films can thus be accomplished at high deposition rate over large area with uniform film thickness and homogeneous quality. Also, highly efficient devices including photoelectric conversion devices represented by solar cells can be manufactured at low-cost by the use of such films.

4 Claims, 7 Drawing Sheets

FOREIGN PATENT DOCUMENTS

| | | |
|---|---|---|
| JP | 2001-189275 | 7/2001 |
| JP | 2001-313272 | 11/2001 |
| WO | 90-12126 | 10/1990 |

OTHER PUBLICATIONS

Harada, et al., "The Creation of Hydrogen Radicals by The Hot-Wire Technique and Its' Application for μc-Si:H" Technical Digest of the International PVSEC-11, Sapporo, Hokkaido, Japan, 1999, pp. 779-780.
Schropp, et al., "Thin Film Poly-Silicon Solar Cells with Low Impurity Concentration Made by Hot Wire Chemical Vapor Deposition" Technical Digest of the International PVSEC-11, Sapporo, Hokkaido, Japan, 1999, pp. 929-930.
Hideki Matsumura, "Formation of Silicon-Based Thin Films Prepared by Catalytic Chemical Vapor Deposition (Cat-CVD) Method" Jpn. J. Appl. Phys. vol. 37 (1998) pp. 3175-3187.
Vetterl, et al., "Thickness Dependence of Microcrystalline Silicon solar Cell Properties" Technical Digest of the International PVSEC-11, Sapporo, Hokkaido, Japan, 1999, pp. 233-234.
Meier, et al., "Microcrystalline Silicon Thin-Film Solar Cells by the VHF-GD Technique" Technical Digest of the International PVSEC-11, Sapporo, Hokkaido, Japan, 1999, pp. 221-223.

* cited by examiner

PECVD

METHOD FOR DEPOSITING A FILM ON A SUBSTRATE USING CAT-PACVD

This application is based on application No. 2002-067445 filed in Japan, the content of which is incorporated hereinto by reference.

BACKGROUND OF THE INVENTION

1. Field of the Invention

The present invention relates to a Cat-PECVD method, a film forming apparatus for implementing the method, a film formed by use of the method, and a device manufactured using the film. In particular, the present invention relates to a technique capable of forming high quality Si-based thin films, which are used in photoelectric conversion devices as typified by Si-based thin film solar cells, at high deposition rate over large area with uniform film thickness and homogeneous film quality.

2. Description of the Related Art

High-quality, high-deposition rate film forming techniques are crucial for improvement in performance and cost reduction of various thin film devices. In particular, for Si-based thin film solar cells that are the typical of photoelectric conversion devices, large-area film formation is also required in addition to high-quality, high-deposition rate formation of Si-based films.

Meanwhile, to classify broadly, there have been two methods known as low temperature film forming techniques: the PECVD (plasma-enhanced chemical vapor deposition) method and the Cat-CVD (catalytic chemical vapor deposition) method (the HW (hot wire)-CVD method follows the same principles). For the both techniques, research and development work has been intensively continuing focusing on the formation of hydrogenated amorphous silicon films and crystalline silicon films including micro-crystalline, mono-crystalline and poly-crystalline silicon films. Hereinafter, "crystalline silicon" is referred to silicon including micro-crystalline, mono-crystalline and poly-crystalline silicons. FIG. 4 illustrates a PECVD apparatus as conventional art 1, and FIG. 5 illustrates a Cat-CVD apparatus as conventional art 2.

In FIG. 4, there are shown a showerhead 400, a gas introduction port 401, gas effusion ports 402, a plasma space 403, an electrode 404 for plasma generation, a radio frequency power supply 405, a substrate 406, a substrate heater 407, and a vacuum pump for exhausting gas 408.

In FIG. 5, there are shown a showerhead 500, a gas introduction port 501, gas effusion ports 502, an active gas space 503, a thermal catalysis body (catalyzer) 504, an electric power source 505 for heating the thermal catalysis body, a substrate 506, a substrate heater 507, and a vacuum pump for exhausting gas 508.

To take a case where a Si film is formed using $SiH_4$ gas and $H_2$ gas as an example, in the PECVD apparatus shown in FIG. 4, the gases introduced from the gas introduction port 401 provided at the showerhead 400 are directed through the gas effusion ports 402 into the plasma space 403, where the gases are excited and activated to yield a decomposed species, which is deposited on the opposed substrate 406 to form a Si film. Here, the plasma is generated by means of the radio frequency power supply 405.

On the other hand, in the Cat-CVD apparatus shown in FIG. 5, the gases introduced from the gas introduction port 501 provided in the showerhead 500 are directed through the gas effusion ports 502 into the film deposition space, where the gases are activated by the thermal catalysis body 504 provided in the space, thereby to yield a decomposed species, which is deposited on the opposed substrate 506 to form a Si film. Here, the heating of the thermal catalysis body is accomplished by means of the heating power source 505.

However, these conventional techniques have the following problems:

In order to achieve high-deposition rate film formation by the PECVD method, it is necessary to promote the decomposition of the $SiH_4$ gas and $H_2$ gas by increasing the plasma power. However, increase of the plasma power on the other hand leads to increase in ion bombardment on the surface for deposition and promotes generation of higher-order silane species that leads to formation of powder. For this reason, this method cannot avoid incurring adverse factors that hinder the improvement of the quality.

Here, instead of increasing the plasma power, when the plasma excitation frequency is set to be in the VHF band or higher, the bombardment of ions is reduced because of the reduction of the plasma potential. This is effective for the formation of high-quality hydrogenated amorphous silicon films and crystalline silicon films. (Refer to J. Meier et al, Technical digest of $11^{th}$ PVSEC (1999) p. 221, O. Vetterl et al, Technical digest of $11^{th}$ PVSEC (1999) p. 233.) However, sincethe formation of crystalline Si films requires sufficient production of atomic hydrogen, increasing the plasma power is inevitable for film formation at a growth rate higher than a certain level, even if VHF band frequencies are used. Accordingly, the above mentioned problems are still unavoidable in such a case.

Also, increasing the hydrogen dilution rate, namely the gas flow ratio ($H_2/SiH_4$), may be considered as a measure for increasing the density of atomic hydrogen without increasing the plasma power. However, this causes the partial pressure of the $SiH_4$ gas to decrease, which works contrary to the high-speed deposition. Therefore, also in this case, it is after all necessary to increase the plasma power so as to promote decomposition of $SiH_4$. The problems mentioned above are therefore still unavoidable.

Meanwhile, increasing the pressure for film deposition may be considered as a measure for reducing the ion bombardment while allowing the plasma power to increase. However, in such a case, the reaction to generate higher-order silane species is accelerated, thereby failing to avoid factors deteriorating the film quality such as formation of powder.

On the other hand, in the Cat-CVD method, because of the nonuse of plasma, the aforementioned problem of ion bombardment does not arise in principle, and the formation of powder is minimal. Moreover, since the generation of atomic hydrogen is greatly accelerated in this method, the formation of crystalline Si films can be accomplished relatively easily and speedily. In addition, since there is no restriction in principle in enlarging the deposition area, this method has been attracting growing attention. (H. Matsumura, Jpn. J. Appl. Phys. 37 (1998) 3175–3187, R. E. I. Schropp et al, Technical digest of $11^{th}$ PVSEC (1999)p. 929–930)

However, under the present circumstances, temperature increase in the substrate due to radiation from the thermal catalysis body is unavoidable. Therefore, stable formation of high quality films is not necessarily easy. In addition, since $SiH_4$ gas is decomposed directly by the thermal catalysis body, atomic Si is inevitably generated. The atomic Si is unfavorable for formation of high quality Si films. Also, radicals such as SiH and $SiH_2$, which are resulted from the reaction of the atomic Si with H and $H_2$ in gas-phase, are unfavorable for formation of high quality Si films. Accordingly, it has been extremely difficult to form high-quality crystalline Si films.

BRIEF SUMMARY OF THE INVENTION

The present invention has been accomplished under these circumstances, and a primary object of the invention is to provide a Cat-PECVD method capable of forming high quality Si-based films and C-based films over large area at high deposition rate with uniform film thickness and homogeneous quality, a film forming apparatus for implementing the method, a film formed by use of the method, and a device manufactured using the film.

The "Cat-PECVD method" here refers to a CVD method which integrates the PECVD method and the Cat-CVD method, incorporating the characteristics of the both methods thereinto. The naming thereof is done by the present inventors.

In the Cat-PECVD method according to the present invention, a material-based gas comprising a gas whose molecular formula includes Si and/or C and a non-Si non-C-based gas comprising a gas whose molecular formula excludes Si and C that is heated by a thermal catalysis body provided in a gas introducing channel are passed separately through a showerhead having a plurality of gas effusion ports to be introduced into a film deposition space and mixed together, where a plasma space is formed by a nonplanar electrode connected to a radio frequency power supply, thereby a film is deposited on a substrate.

The "nonplanar electrode" here refers to an electrode having an antenna-style, an antenna-style (ladder-style), or a spoke-style geometry.

A film forming apparatus according to the present invention is an apparatus for implementing the aforementioned Cat-PECVD method, which comprises: a first introduction channel for introducing a non-Si non-C-based gas comprising a gas whose molecular formula excludes Si and C; a thermal catalysis body provided in the first introduction channel for heating the non-Si non-C-based gas introduced thereinto; a second introduction channel for introducing a material-based gas comprising a gas whose molecular formula includes Si and/or C; a showerhead having a plurality of gas effusion ports for directing the material-based gas and non-Si non-C-based gas heated by the thermal catalysis body into a film deposition space separately from each other; and a nonplanar electrode connected to a radio frequency power supply for forming a plasma space in the film deposition space.

In the Cat-PECVD method and the film forming apparatus according to the present invention, at least the non-Si non-C-based gas is heated by the thermal catalysis body which is provided in the channel for introducing the gas and connected to a heating power source. The material-based gas and the non-Si non-C-based gas are separately introduced into the film deposition space through the showerhead having a plurality of gas effusion ports. It is possible to form a plasma space in the film deposition space by the nonplanar electrode that is connected to the radio frequency power supply, thereby a film can be deposited on the substrate. Accordingly, formation of high-quality Si-based films and C-based films can be accomplished at high deposition rate over large area with uniform film thickness and homogeneous film quality.

In addition, because of the thermal catalysis body, the amount of decomposition and activation of the non-Si non-C-based gas can be freely controlled independently from the amount of decomposition and activation of the material-based gas by plasma. Since the material-based gas is activated solely by the plasma, generation of unfavorable radicals caused by the thermal catalysis body can be avoided.

The use of the thermal catalysis body has a gas heating effect as a secondary effect, which suppresses the reaction in gas-phase that produces higher-order silane species. In addition, the use of the showerhead further facilitates the formation of large-area films with uniform thickness and homogeneous quality.

Furthermore, by the use of the film formed by the Cat-PECVD method according to the present invention, highly efficient devices including photoelectric conversion devices represented by Si-based thin-film solar cells can be manufactured at low cost.

The present invention is hereinafter described more in detail with reference to the appended drawings.

DETAILED DESCRIPTION OF THE INVENTION

Figure 1:
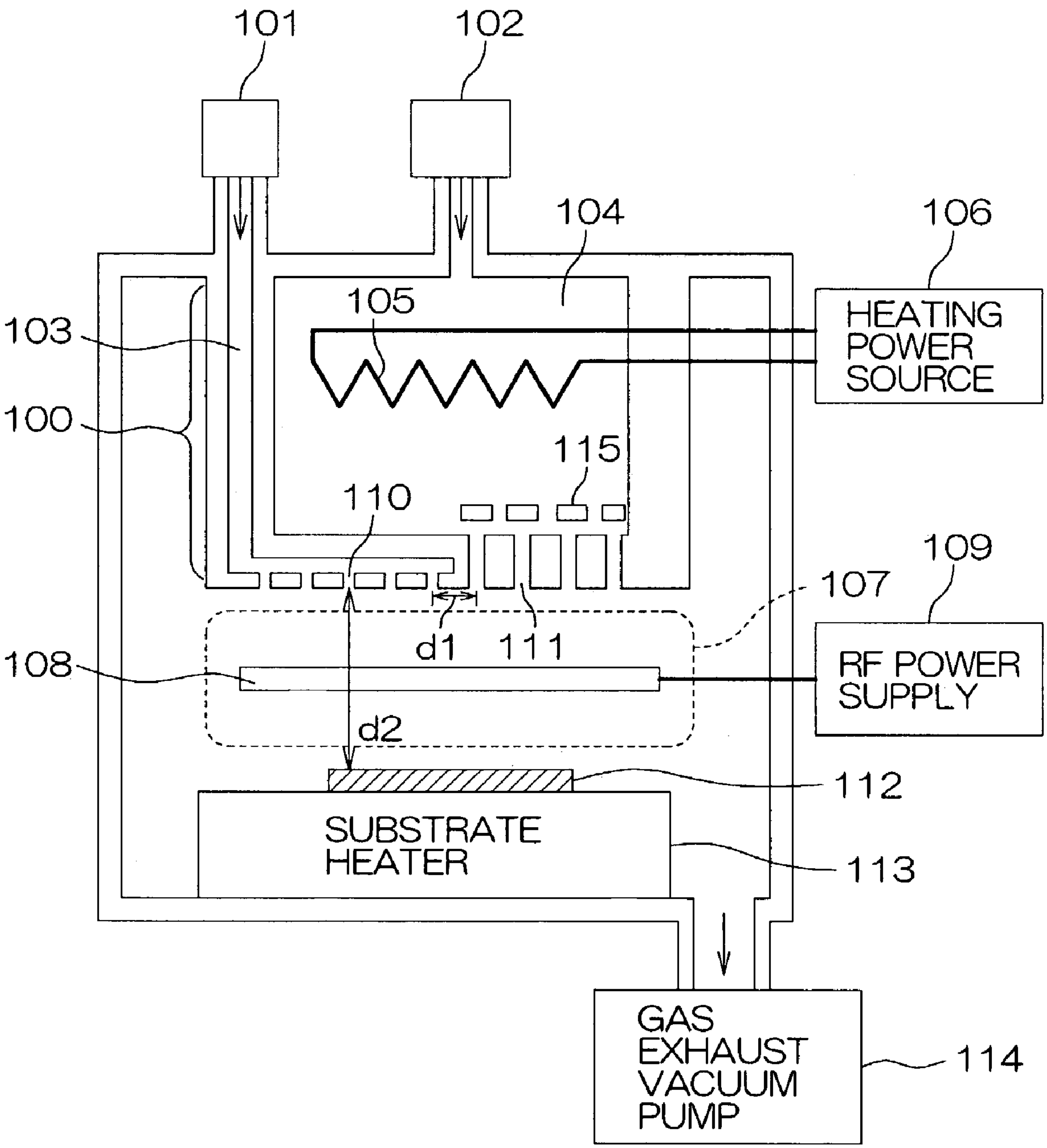
FIG. 1 illustrates a first embodiment of the method according to the present invention.

FIG. 1 illustrates a film forming apparatus for implementing the Cat-PECVD method according to a first embodiment of the present invention. In this film forming apparatus, a showerhead and a nonplanar electrode for plasma generation are separately provided.

In the drawing, there are shown a showerhead 100, an introduction port 101 for introducing a material-based gas comprising a gas whose molecular formula includes Si and/or C (hereinafter simply referred to as "material-based gas"), an introduction port 102 for introducing a non-Si non-C-based gas comprising a gas whose molecular formula excludes Si and C (hereinafter simply referred to as "non-Si non-C-based gas"), a material-based gas introducing channel 103, a non-Si non-C-based gas introducing channel 104, a thermal catalysis body 105, an electric power source 106 for heating the thermal catalysis body, a plasma space 107, a nonplanar electrode 108 for plasma generation, a radio frequency power supply 109 for plasma generation, material-based gas effusion ports 110, non-Si non-C-based gas effusion ports 111, a substrate 112 on which a film is deposited, a heater 113 for heating the substrate, and a vacuum pump 114 for exhausting gas.

Figure 2:
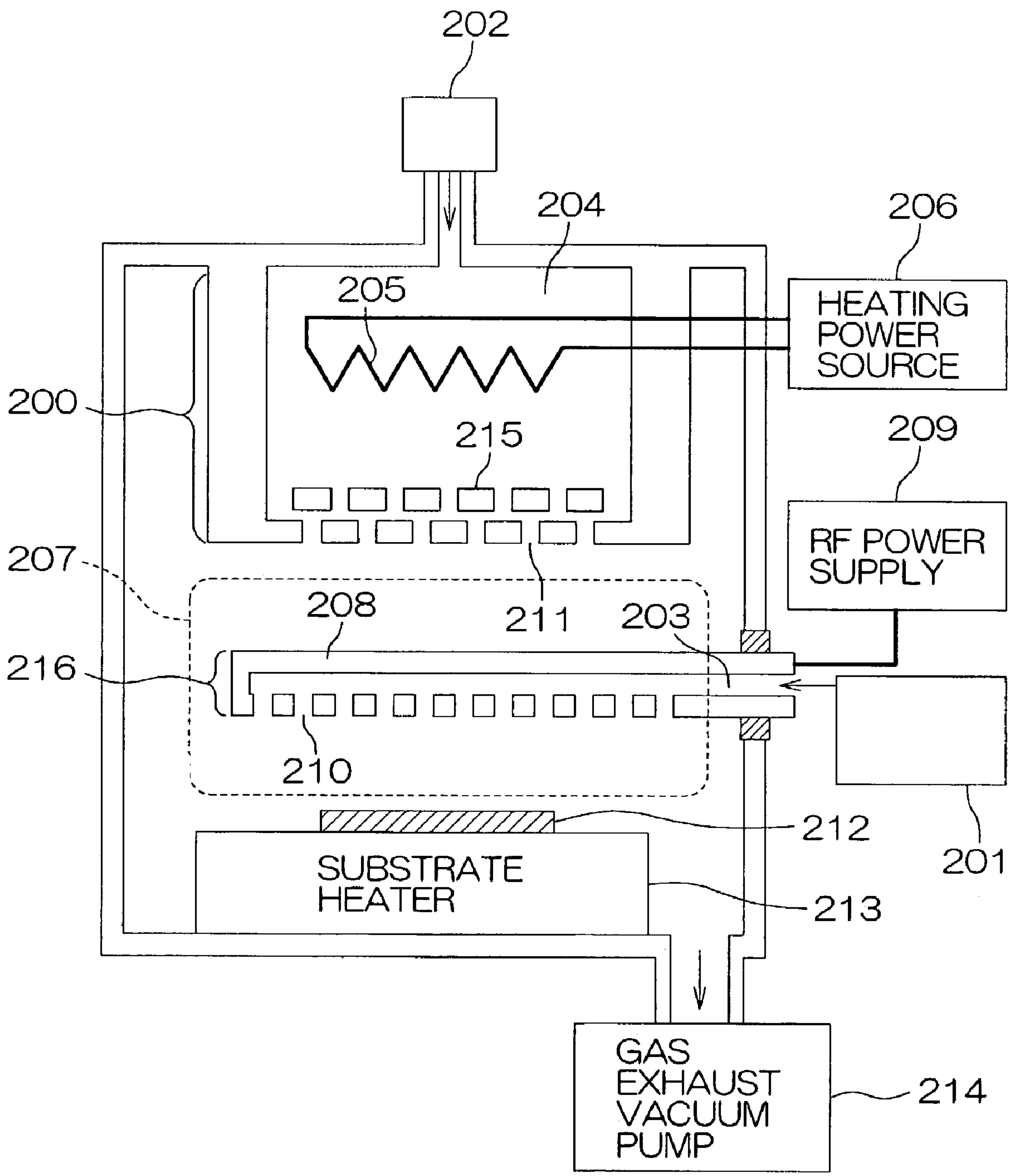
FIG. 2 illustrates a second embodiment of the method according to the present invention.

FIG. 2 illustrates a film forming apparatus for implementing the Cat-PECVD method according to a second embodiment of the present invention. In this film forming apparatus, the showerhead comprises a first showerhead provided separately from a nonplanar electrode and a second showerhead formed integrally with a nonplanar electrode.

In the drawing, there are shown a first showerhead 200, an introduction port 201 for introducing material-based gas comprising a gas whose molecular formula includes Si and/or C, an introduction port 202 for introducing non-Si non-C-based gas, a material-based gas introducing channel 203, a non-Si non-C-based gas introducing channel 204, a thermal catalysis body 205, an electric power source 206 for heating the thermal catalysis body, a plasma space 207, a nonplanar electrode 208 for plasma generation formed integrally with a second showerhead 216, a radio frequency power supply 209 for plasma generation, material-based gas effusion ports 210, non-Si non-C-based gas effusion ports 211, a substrate 212 on which a film is deposited, a heater 213 for heating the substrate, a vacuum pump 214 for exhausting gas, and a radiation shielding member 215.

Figure 3:
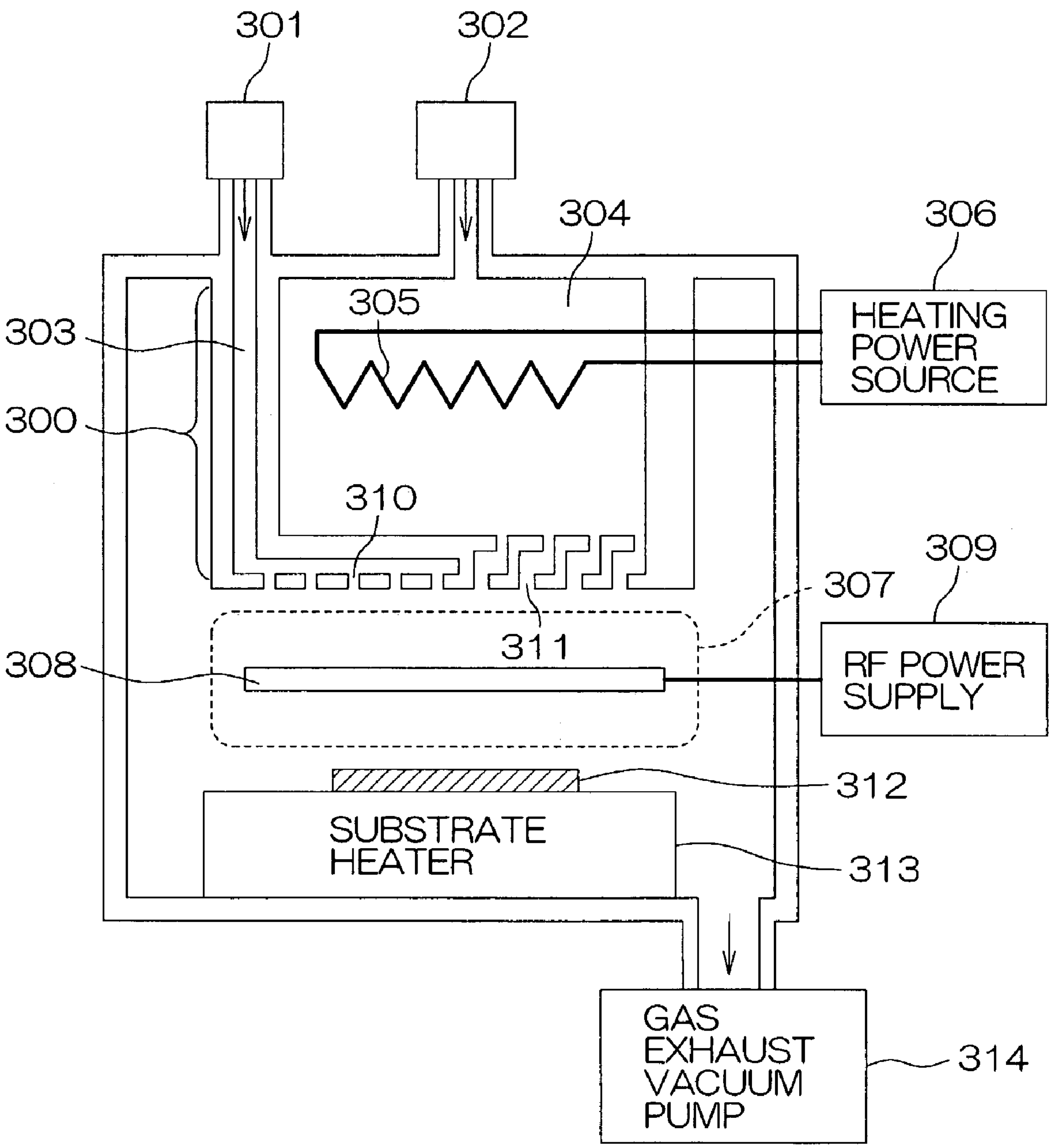
FIG. 3 illustrates a third embodiment of the method according to the present invention.
Figure 4:
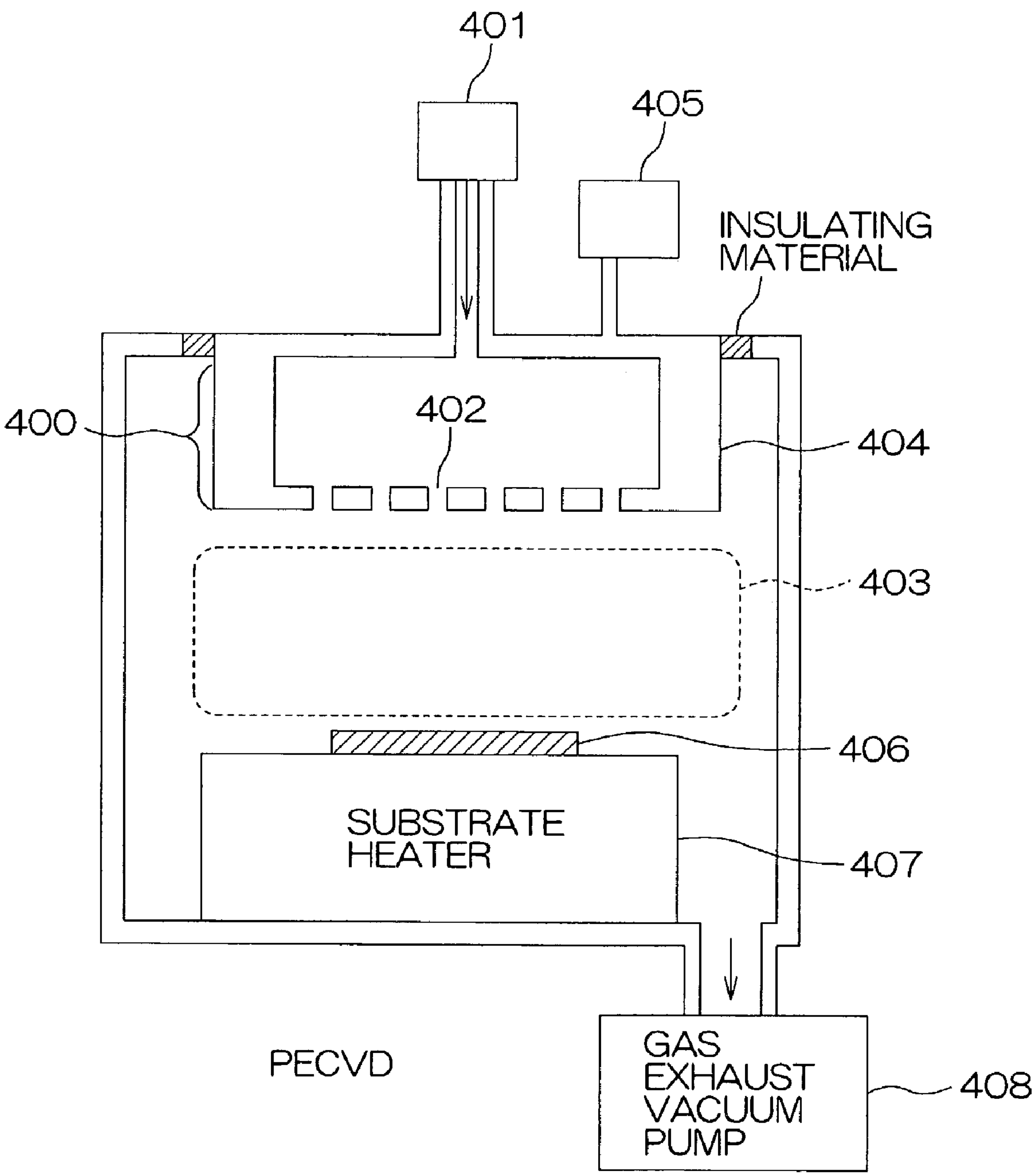
FIG. 4 illustrates a first example of a conventional method.
Figure 5:
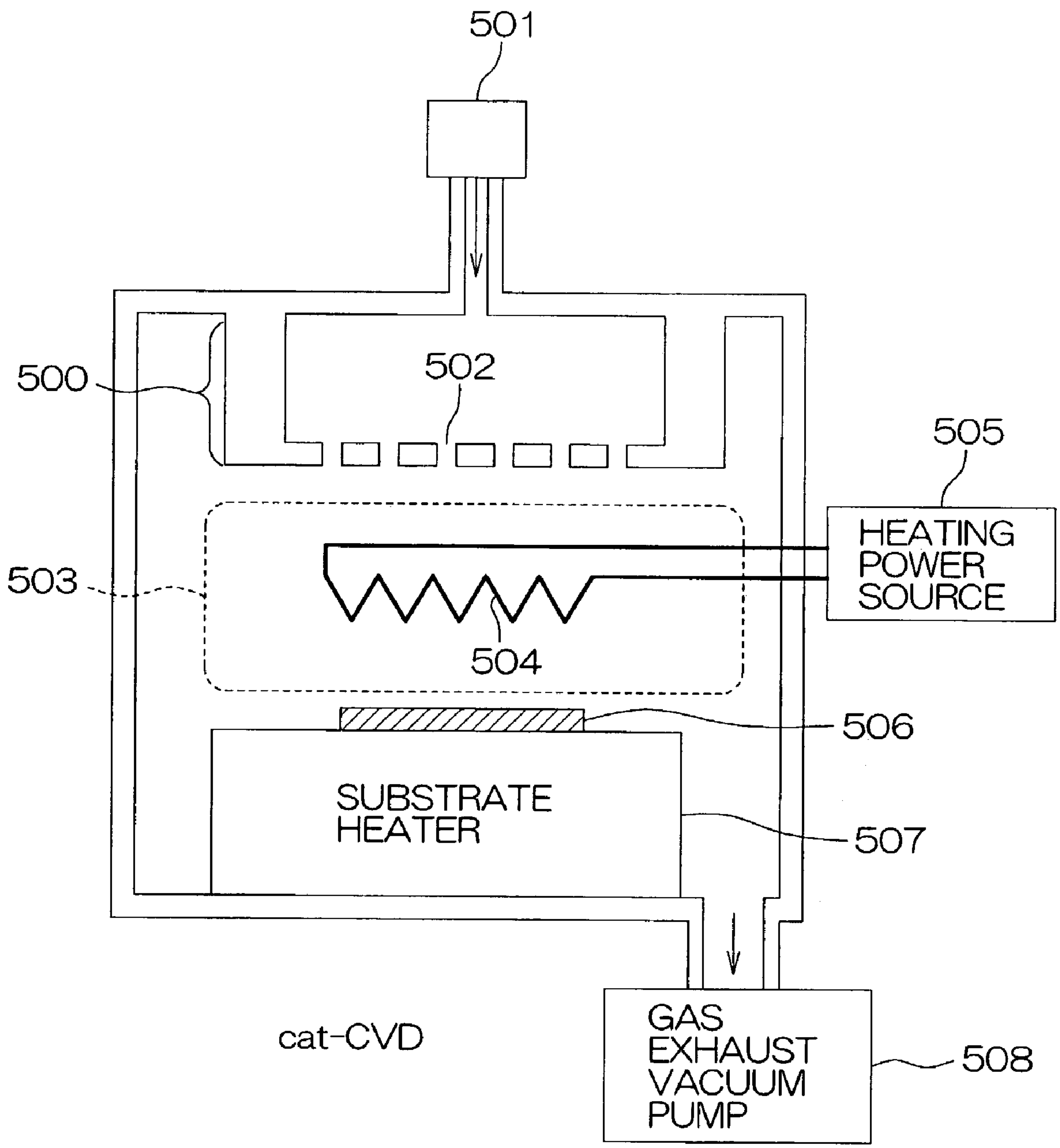
FIG. 5 illustrates a second example of a conventional method.

FIG. 3 illustrates a film forming apparatus for implementing the Cat-PECVD method according to a third embodiment of the present invention. In this film forming apparatus, the radiation shielding arrangement in the showerhead is varied from that in the first embodiment.

In the drawing, there are shown a showerhead 300 in which nonlinear gas effusion paths are employed for realizing a radiation shielding structure, an introduction port 301 for introducing material-based gas, an introduction port 302 for introducing non-Si non-C-based gas, a material-based gas introducing channel 303, a non-Si non-C-based gas introducing channel 304, a thermal catalysis body 305, an electric power source 306 for heating the thermal catalysis body, a plasma space 307, a nonplanar electrode 308 for plasma generation, a radio frequency power supply 309 for plasma generation, material-based gas effusion ports 310, non-Si non-C-based gas effusion ports 311, a substrate 312 on which a film is deposited, a heater 313 for heating the substrate, and a vacuum pump 314 for exhausting gas.

The vacuum pump 314 for exhausting gas is preferably a dry-type vacuum pump such as a turbo-molecular pump so as to prevent impurities from getting into the film from the exhaust system. Here, the ultimate vacuum is at least 1E-3 Pa, and more preferably, it is 1E-4 Pa or less. The pressure during the film formation is in the range of about 10–1000 Pa. The temperature for heating the substrate 312 by the heater 313 is in the range of 100–400.degree.C., and more preferably, it is in the range of 150–300.degree.C.

Hereinafter, description of portions that are in common among Embodiments 1, 2, and 3 will be represented by the description given to Embodiment 1, and portions that differ from one another will be described according to the respective Embodiments.

<Geometry of Electrode>

Figure 6:
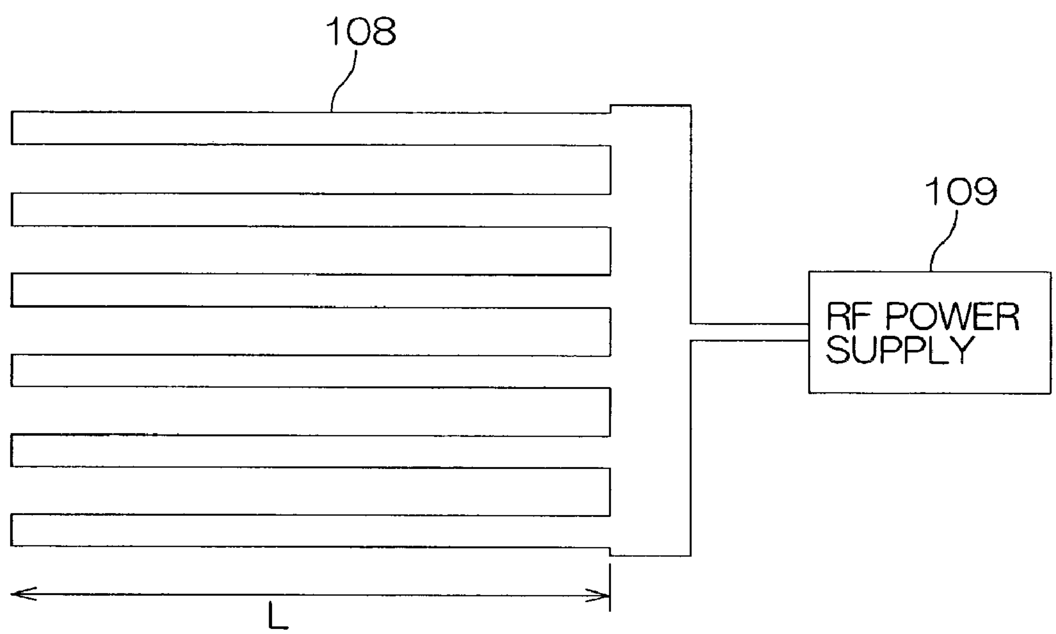
FIG. 6 illustrates one example of the nonplanar electrode in the method according to the present invention.
Figure 7:
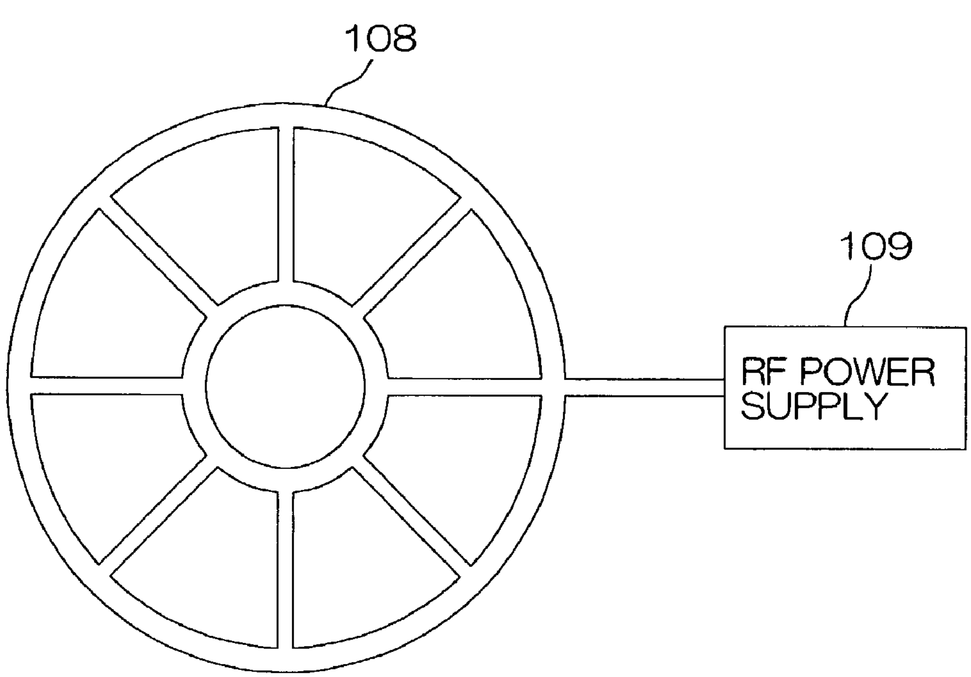
FIG. 7 illustrates another example of the nonplanar electrode in the method according to this invention.

An explanation is now given to the nonplanar electrode 108 for plasma generation. A specific geometry of the nonplanar electrode 108 may be the kind shown in FIG. 6, which comprises a plurality of bar-shaped electrodes juxtaposed to one another and is generally called an “antenna-style” or a “ladder-style”, or may be a spoke antenna-style shown in FIG. 7.

In general, the relationship between frequency f and wavelength $\lambda$ of the radio frequency power supply 109 is given in plasma as $\lambda=v/f$. Here, v is the velocity of propagation of electromagnetic waves in plasma, which is smaller than speed c (speed of light) of electromagnetic waves in vacuum. Accordingly, $\lambda$ is smaller than c/f.

To discuss a length L of one side of a rectangular electrode as a typical size of the electrode 108 for plasma generation, when $\lambda$>>L, electromagnetic interference (standing wave) does not arise, and hence a homogeneous plasma is formed. As a result, films with uniform thickness and homogeneous quality can be formed. For example, when f=13.5 MHz, $\lambda$ is about 22 m at the maximum. This explains that the influence of electromagnetic interference is insignificant in the case of a 1 square meter-size electrode 108 for plasma generation. However, when $\lambda$/4 comes in the vicinity of L or below as the frequency f of the radio frequency power supply 109 rises, the influence of electromagnetic interference becomes too great to be negligible. For example, when f=60 MHz, $\lambda$/4 is 1.25 m at the maximum. A simple, planar, 1 square meter electrode for plasma generation therefore incurs the influence of electromagnetic interference. In such a case, even distribution of electromagnetic field cannot be expected, which means uniform plasma generation cannot be expected. For this reason, generally, an antenna-style, a ladder-style or spoke antenna-style nonplanar electrode 108 is employed instead of such a planar electrode for plasma generation for regions where the frequency of the radio frequency power supply 109 is about 40 MHz or more that is in the VHF band or higher, thereby to accomplish uniform plasma generation. This can be utilized in the Cat-PECVD method of the present invention.

<Method for Supplying Electric Power>

Method for supplying electric power are now described. In cases where an antenna-style electrode is employed as the nonplanar electrode 108 for plasma generation, a radio frequency power from the radio frequency power supply 109 may be distributed among the plurality of bar-shaped electrodes, or a plurality of such radio frequency power supplies 109 may be provided for the respective bar-shaped electrodes. Additionally, in order to prevent unwanted interference from occurring, it is preferable that the radio frequency powers differ in phase at least between adjacent electrodes.

<Method for Supplying Radio Frequency Power>

Another method for further facilitating the formation of large-area films with uniform thickness and homogeneous quality is a multiple application of radio frequency power in which a plurality of radio frequency powers having different frequencies are applied to the electrode 108 for plasma generation so that a plurality of plasmas having different spatial density distributions are overlapped one another. Still another method is to temporally vary and modulate the frequency of the radio frequency power so as to vary the spatial density distribution of the plasma for taking the time average thereof thereby consequently accomplishing uniform film formation. Incidentally, by intermittently supplying radio frequency power to the electrode 108 for plasma generation by means of, for example, pulse-modulating the plasma, formation and growth of powder can be suppressed as compared with the case of continuous plasma generation, which is effective in some cases for improvement of the film quality.

<Relationship Between Showerhead and Electrode>

To classify broadly, there are three types of relationships between the showerhead 100 and the nonplanar electrode 108 for plasma generation.

(1) The first type is the simplest type as shown in FIG. 1 in which the showerhead 100 and the electrode 108 for plasma generation are separately provided. In this arrangement, gas effusion and plasma generation can each be controlled to be uniform independently by the showerhead 100 and nonplanar electrode 108, respectively. Designing of the apparatus and handling thereof are therefore relatively easy. However, since the material-based gas needs to flow from the showerhead 100 toward the substrate 112 through clearances in the nonplanar electrode 108, unevenness in gas flow may arise depending on the geometry and the area of the nonplanar electrode 108. Therefore, there may be cases where this type of relationship is not necessarily preferable for large-area film formation with uniform film thickness and homogeneous film quality.

(2) The second type is the one shown in FIG. 2 in which the apparatus is arranged to comprise the first showerhead 200 which is separately provided from the nonplanar electrode 208, and the second showerhead 216 which is integrally formed with the nonplanar electrode 208, in which the second showerhead 216 integrally formed with the nonplanar electrode 208 is arranged to effuse the material-based gas therefrom. This arrangement allows the material-based gas to be adequately supplied to portions under the shade of the electrode 108 for plasma generation, thereby mitigating the aforementioned problem.

In this case, when the first showerhead 200 is substituted with the showerhead 100 shown in FIG. 1 so that the two showerheads simultaneously effuse the material-based gas (not shown in the drawings), deposition can be accomplished with more uniformity in thickness and homogeneity in quality.

Additionally, it is also possible in some events to reverse the above described relationship between the material-based gas and the non-Si non-C-based gas so that the material-based gas is effused from the first showerhead 200 and the non-Si non-C-based gas is effused from the second showerhead 216. By this arrangement, in cases where $H_2$ gas is used as the non-Si non-C-based gas, it becomes easier to control generation of active hydrogen gas to be uniform, and hence, for example, it becomes easier to uniformize the distribution of crystallization ratio in crystalline Si films.

(3) Finally, the third type is one which is not shown in the drawings, in which the first showerhead 200 is eliminated in the second type arrangement, and the second showerhead 216 is arranged to be complete with the functions to effuse the material-based gas and the non-Si non-C-based gas separately from each other, and to accommodate a thermal catalysis body so as to be disposed in a channel for introducing the non-Si non-C-based gas. In this type, while the electrode for plasma generation may have a complicated structure, since the gas effusion ports are provided only in the electrode for plasma generation, film deposition can be performed simultaneously on both sides with the electrode for plasma generation interposed in between. This is an advantage leading to great improvement in productivity of the apparatus.

<Frequency of Radio Frequency Power Supply>

The Cat-PECVD method and film forming apparatus according to the present invention are characterized in that the electrode 108 for plasma generation is connected to the radio frequency power supply 109, and the frequency of the radio frequency power supply 109 is 13.56 MHz or more. The advantageous effect of the present invention, in other words, the large-area film formation with uniform film thickness and homogeneous film quality, is significantly exhibited particularly in a high frequency range of 27 MHz or more, which is within or higher than so-called VHF band. That is, in the cases of conventional planar electrodes for plasma generation, the frequency at which films about 1 square meter in size can be formed in large area with uniform thickness and homogeneous quality without much difficulty is not more than about 27 MHz, and such film formation is not necessarily easy at frequencies higher than this level. On the other hand, large area film formation can be accomplished with far more excellent properties even at a high frequency range of more than 27 MHz by the present invention. The high frequencies in the VHF band may be arbitrarily selected as continuous quantity, and preferably an optimal frequency is selected according to the size and configuration of the electrode. However, in normal cases, it will be sufficient to use the frequencies that are frequently used in the industry such as 40 MHz, 60 MHz, 80 MHz, and 100 MHz. Here, the higher the frequency of the radio frequency power supply 109 is, the higher the electron concentration in the plasma is. The rate of decomposition and activation of the material-based gas is increased accordingly, thereby increasing the deposition rate. In cases where $H_2$ gas is used as the non-Si non-C-based gas, since the ratio of atomic hydrogen to be generated is increased, more significant crystallization promoting effect can be obtained. Accordingly, crystalline Si films can be obtained even in a condition for high-speed deposition. Moreover, according to the present invention, activation of the non-Si non-C-based gas can be accelerated by use of the thermal catalysis body. Accordingly, when $H_2$ gas is employed as the non-Si non-C-based gas, the crystallization promoting effect is enhanced in addition to the aforementioned effect of the VHF band frequency itself. Thus, crystalline Si films with high quality can be obtained even in a condition for higher-speed deposition.

Incidentally, there is no necessity to limit the frequency of the radio frequency power supply to those within the VHF band up to about 100 MHz, but frequencies in the higher UHF band and those in the microwave range can also be used.

When the radiation shielding member 115,215 is used, the radiation shielding member 115,215 is preferably be provided with a great number of holes for passing gas so as not to block the flow of gas.

<Radiation Shielding Structure>

In the Cat-PECVD method and the film forming apparatus according to the present invention, the showerhead 100 preferably has a structure that prevents radiation emitted from the thermal catalysis body 105 from being directly delivered to the substrate 112.

In this embodiment, such a radiation shielding structure is embodied by the use of the radiation-shielding member 115, 215 shown in FIGS. 1, 2, or by arranging the gas effusion ports of the showerhead 300 in a nonlinear manner as shown in FIG. 3. By this structure, radiation from the thermal catalysis body 105 is shielded and prevented from being directly delivered to the surface of the substrate 112. As a result, unfavorable temperature increase in the substrate 112 can be suppressed, thereby the film quality can be controlled to be more stable.

<Method for Gas Effusion>

The distance d1 between the gas effusion ports 110 for the material-based gas and the gas effusion ports 111 for the non-Si non-C-based gas of the showerhead 100 that are adjacent to each other is preferably the distance d2 between the showerhead 100 and the substrate 112 or less.

This arrangement further facilitates homogenization of the mixed gases, and makes it easier to accomplish uniformization of the film thickness and homogenization of the film quality over a large area. In order to further promote uniformization of the film thickness and homogenization of the film quality over a large area, the arrangement may be such that the material-based gas and the heated non-Si non-C-based gas are mixed together while they are passing through the showerhead 100.

As described so far, by the combination of the nonplaner electrode 108 for plasma generation with the showerhead 100, large-area films of 1 square meter in size can be formed with uniform thickness and homogeneous quality with comparative ease, which is not necessarily easy for the conventional combination of a planar electrode for plasma generation with a showerhead to accomplish. Namely, the film thickness distribution can be controlled to be within a fluctuation range of ±15% or less, the filmquality distribution, for example, thecrystallization ratio can be controlled to be within a fluctuation range of ±15% or less, and as Si thin-film solar cell property distribution, the conversion efficiency can be controlled to be within a fluctuation range of ±10% or less.

<Substrate Bias>

When a direct current power source or a radio frequency power supply that operates at a frequency range lower than that of the radio frequency power supply 109 for plasma generation is connected to the electrode on the side of the substrate so that a bias voltage can be applied to the substrate 112, the degree of the ion bombardment on the substrate 112 can be controlled. This is effective for cleaning the substrate surface before film deposition and controlling the film quality with properly controlled ion bombardment during film deposition.

<Thermal Catalysis Body (Catalyzer)>

The thermal catalysis body 105 comprises a metal material at least in its substrate. The metal material preferably comprises, as a main component thereof, at least one high-melting point metal selected from the group consisting of Ta, W, Re, Os, Ir, Nb, Mo, Ru, and Pt. For the thermal catalysis body 105, while a metal material formed into a wire shape described above is usually employed, the form is not limited to such a wire shape but may be the form of a plate or a mesh. Incidentally, in the event where impurities unfavorable for film deposition are included in the metal material for the thermal catalysis body, an effective measure to reduce the impurities is to preheat the thermal catalysis body 105 for several minutes or more at a temperature equal to or higher than the temperature during a film deposition before it is used for the film deposition.

<Power Source for Heating Thermal Catalysis Body>

For the power source 106 for heating the thermal catalysis body 105, normally a direct-current power source is conveniently used. However, using an alternating current power source causes no inconvenience. In addition, when a direct-current power source is used, as will be later described, the arrangement may be such that direct current is supplied to the thermal catalysis body 105 in a pulsive manner so as to control the degree of heating or decomposition and. activation of the non-Si non-C-based gas.

<Activation of Non-Si Non-C-Based Gas>

The non-Si non-C-based gas is heated by the thermal catalysis body 105 and directed toward the plasma space 107, while a part of it is decomposed and activated by the thermal catalysis body 105, the degree of which is proportional to the temperature of the thermal catalysis body. To take $H_2$ gas as an example, while it depends on the pressure, generation of atomic hydrogen due to the decomposition-.reaction becomes significant around the point at which the temperature of the thermal catalysis body exceeds approximately 1000.degree.C. This atomic hydrogen significantly contributes to acceleration of crystallization of Si films. Additionally, even when the temperature of the thermal catalysis body is approximately 1000.degree.C. or below at which generation of atomic hydrogen is not too significant, and therefore the effect of accelerating crystallization can not be expected to be significant, since the use of the thermal catalysis body brings about a gas heating effect as a secondary effect, the reaction to produce higher-order silane species can be suppressed. Accordingly, film deposition even under such a thermal condition is still effective for formation of high-quality hydrogenated amorphous silicon films. However, in order to obtain the above described effect, the temperature of the thermal catalysis body is preferably at least 100.degree.C. or more, or more preferably, 200.degree-.C.or more. At temperatures of 200.degree.C. or more, the gas heating effect can be more significant. The maximum temperature is preferably 2000.degree.C. or below, or more preferably, 1900.degree.C. or below. This is because problems such as release of gaseous impurities from the thermal catalysis body and parts around it and evaporation of the material of the thermal catalysis body itself may arise at temperatures above 1900.degree.C.

<Method for Controlling Activation Degree>

Apart from the control by means of the temperature of the thermal catalysis body described above, control of the degree of heating or decomposition and activation of the non-Si non-C-based gas, which is typically represented by $H_2$ mentioned above, can be accomplished by the following five methods:

(1) The first method is to control the surface area of the thermal catalysis body 105. By this method, the degree of heating or decomposition and activation of the non-Si non-C-based gas can be controlled without decrease in temperature of the thermal catalysis body so that it can be maintained at a temperature higher than a certain level. For example, when a linearly shaped component is used for the thermal catalysis body 105, the surface area of the thermal catalysis body 105 can be controlled by the choice of length and diameter. Because changing the length or the diameter of the thermal catalysis body 105 during the use of the apparatus is practically difficult, it may be arranged such that a plurality of thermal catalysis bodies 105 each of which can be heated independently are provided (not shown in the drawings) and the number of the thermal catalysis bodies to be heated is determined according to the need. In such a manner, the degree of heating or decomposition and activation of the non-Si non-C-based gas can be varied step-by-step.

(2) The second method is to perform heating of the thermal catalysis body 105 intermittently or periodically. Specifically, the electric power of the power source 106 for heating is given intermittently in a pulsed manner or a low frequency AC power source is used so that the heating of the thermal catalysis body can be effected periodically. By this method, durations of the reaction between the non-Si non-C-based gas and the thermal catalysis body 105 per unit time can be continuously controlled, and hence the degree of heating or decomposition and activation of the non-Si non-C-based gas can be controlled continuously.

(3) The third method is to allow the distance between the thermal catalysis body 105 and the gas effusion ports 111 for the non-Si non-C-based gas of the showerhead 100 to be variable. Since decomposed and activated non-Si non-C-based gas has a duration of life, the degree of decomposition and activation of the non-Si non-C-based gas effused from the gas effusion ports 111 for the non-Si non-C-based gas can be decreased by extending the distance, and increased by reducing the distance.

(4) The fourth method is adjustment by designing the bore diameters of the non-Si non-C-based gas effusion ports 111 and those of the material-based gas effusion ports 110 differently from each other, or by designing the total number of the non-Si non-C-based gas effusion ports 111 and that of the material-based gas effusion ports 110 differently from each other. By reducing the bore diameters of the non-Si non-C-based gas effusion ports 111 or decreasing the total number of the same, the amount of heated or decomposed and activated non-Si non-C-based gas effused into the plasma space 107 can be reduced, and by expanding the bore diameters of the non-Si non-C-based gas effusion ports 111 or increasing the total number of the same, the amount of heated or decomposed and activated non-Si non-C-based gas effused into the plasma space 107 can be increased.

(5) The fifth method is to add a channel (not shown in the drawings) for introducing the non-Si non-C-based gas which is not provided with a thermal catalysis body, thereby to independently control each of the amount of non-Si non-C-based gas flow passing through the thermal catalysis body and the amount of non-Si non-C-based gas flow not passing through the thermal catalysis body. By this arrangement, the non-Si non-C-based gas that is heated or decomposed and activated and the non-Si non-C-based gas that is not heated can be blended at an arbitrary gas flow ratio, and hence the concentration of the heated or decomposed and activated non-Si non-C-based gas to be effused from the showerhead 100 toward the plasma space 107 can be varied continuously. Meanwhile, the gas-introducing channel for non-Si non-C-based gas to be not heated may be merged with the material-based gas introducing channel 103.

<Material for Gas Channel>

It is preferable that at least a part of a surface of at least any one of an inner wall of a gas pipe, an inner wall of the showerhead and the radiation shielding member in the non-Si non-C-based gas introducing channel 104 comprises a material including at least one of the group consisting of Ni, Pd and Pt. Since these metal elements serve a catalytic function to promote dissociation of gas molecules such as $H_2$, it is possible to reduce the possibility of recombination and inactivation of decomposed and activated non-Si non-C-base gas on the surfaces of the above-mentioned members.

<Heating of Material-based Gas>

The material-based gas introducing channel 103 is preferably provided with a thermal catalysis body (made of the same material as that of the thermal catalysis body 105) in order to promote the gas heating effect. However, in order not to cause the material-based gas to be decomposed due to the thermal catalysis body, the temperature of the thermal catalysis body should be controlled to be below the temperature at which the material-based gas decomposes. In cases where $SiH_4$ is used as the material-based gas, the temperature is so controlled as to be 500.degree.C. or below, or desirably, 400.degree.C. or below.

There is another method for promoting the gas heating effect, which is to heat the internal wall surface of the film deposition chamber. Specifically, a heater (not shown in the drawings) is provided within the film deposition chamber so as to accomplish the heating of the internal wall surface of the film deposition chamber. In this case, when the material-based gas includes a gas containing Si, the temperature of the heater mentioned above is so controlled as to be 500.degree.C. or below, or desirably, 400.degree.C. or below.

<Doping Gas Introducing Method>

When a doping gas is fed, it can be introduced into the material-based gas introducing channel 103 or the non-Si non-C-based gas introducing channel 104. In this case, $B_2H_6$ and the like may be used as p-type doping gas, and $PH_3$ and the like may be used as n-type doping gas.

<Electric Circuit>

In the circuit of the power source 106 for heating thermal catalysis body, a pass condenser or capacitor (not shown) is preferably provided as a method for blocking radio frequency. By this method, radio frequency components from the radio frequency power supply can be prevented from entering, and stable film formation can therefore be further ensured.

<Substrate Geometry>

The geometry of the substrate 112 may be planar for devices such as solar cells, and nonplanar shapes such as cylindrical shapes may be employed for devices such as photosensitive drums.

<CVD Apparatus>

Figure 8:
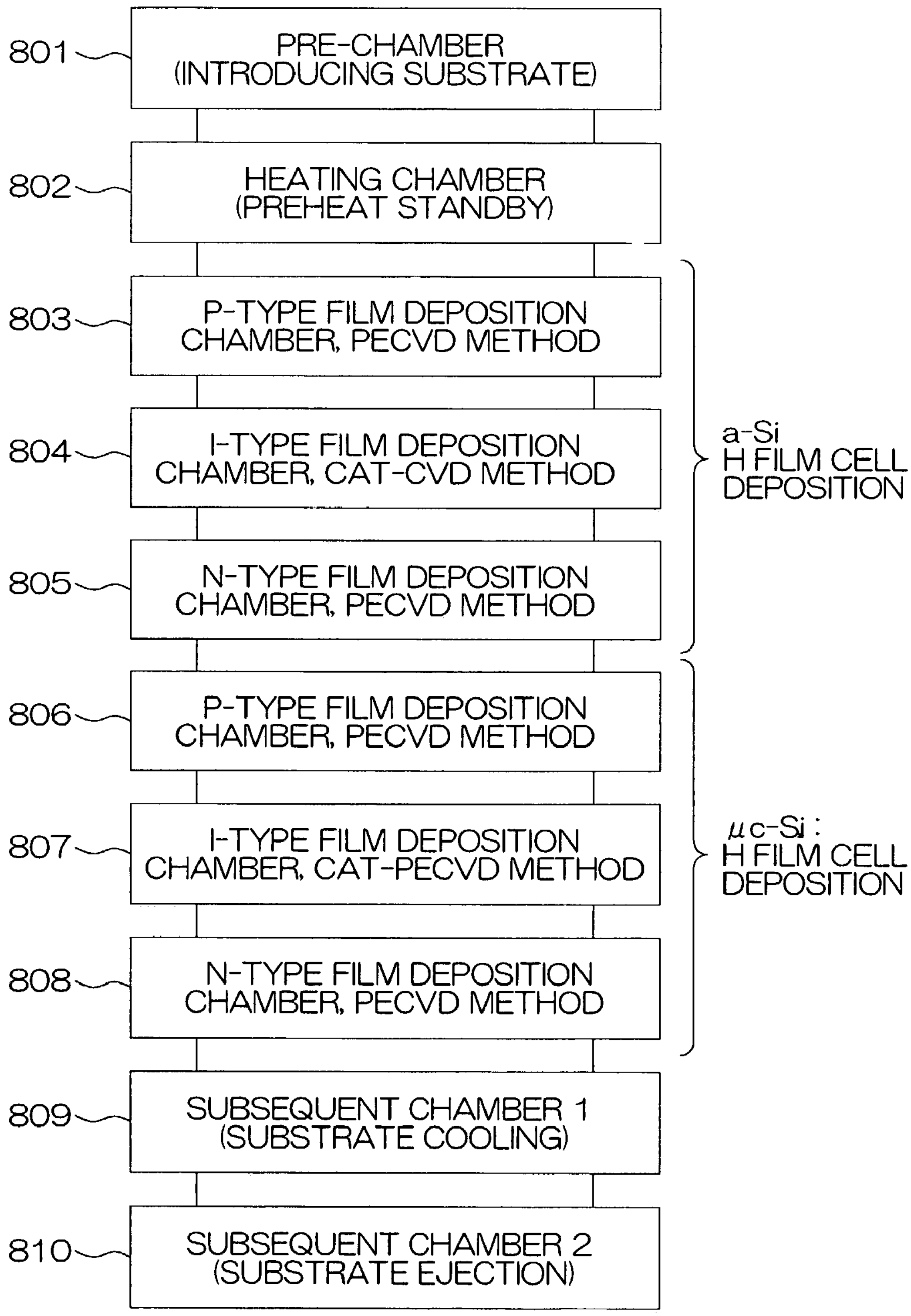
FIG. 8 illustrates an embodiment of the CVD apparatus according to the present invention.

The CVD apparatus for implementing the Cat-PECVD method according to the present invention is an apparatus, as shown in FIG. 8, which comprises a plurality of vacuum chambers 801 to 810 including at least one film deposition chamber capable of implementing the aforementioned method.

Here, the plurality of vacuum chambers preferably include at least film deposition chambers for forming p-type films 803, 806, film depositionchambers for forming i-type films 804, 807, and film deposition chambers for forming n-type films 805, 808, wherein at least the film deposition chamber for forming i-type films 807 and/or 804 is film deposition chamber capable of implementing the Cat-PECVD method.

In addition, it is preferable that at least one of the plurality of the vacuum chambers is a film deposition chamber capable of implementing the Cat-CVD method. By this arrangement, for example, hydrogenated amorphous silicon films can be formed at high deposition rate with high quality by the Cat-CVD method, which enables hydrogenated amorphous silicon films to be employed, for example, for photoactive layers in the top cells of tandem solar cells, thereby expanding the possibility of combinations in forming multiple layer films. It has been known that the hydrogen concentrations of hydrogenated amorphous silicon films formed by the Cat-CVD method can be lower than those of the hydrogenated amorphous silicon films formed by the PECVD method. Therefore, further improved light absorption property and smaller optical band gap can be achieved. Also advantageously, deterioration due to light, which is the long time problem in hydrogenated amorphous silicon, can be reduced to a low level.

The plurality of vacuum chambers preferably include at least one film deposition chamber capable of implementing the PECVD method. This allows film deposition to be effected on the surfaces of films that are susceptible to reduction by atomic hydrogen such as transparent conductive oxide films in a condition in which the reduction reaction is suppressed as much as possible, so that the possibility of combinations in forming multiple layer films can be expanded.

In addition, the plurality of vacuum chambers preferably include at least a pre-chamber 801 so as not to expose the film deposition chambers to the ambient air, and the plurality of vacuum chambers preferably include the pre-chamber 801 and subsequent chambers 809 and 810 for improvement of productivity. Furthermore, the plurality of vacuum chambers preferably include a heating chamber 802 also for improvement of productivity.

The plurality of vacuum chambers 801 to 810 may be arranged such that the plurality of vacuum chambers are linearly connected to one another in a row, or the plurality of vacuum chambers may be arranged so as to be connected to a core chamber present at least one in number, thereby to form a star-like configuration.

When the film deposition is performed in a horizontal-style deposition chamber, it may be performed in a deposit-down style in which the deposition species is deposited on the substrate 112 from the gravitationally higher side with respect to the substrate 112. To the contrary, the film deposition may be performed in a deposit-up style in which the deposition species is deposited on the substrate 112 from the gravitationally lower side with respect to the substrate 112. The former style has the advantage that, because of good adhesion between the substrate 112 and the heater 113, it is easy to achieve even thermal distribution all over the substrate. However, the former style also has the problem of susceptibility to deposition of foreign objects such as powder falling thereon. On the other hand, the latter style can reduce the degree of deposition of foreign objects such as powder, but has the problem that it is difficult to achieve even thermal distribution over the substrate due to bending of the substrate or the like. The selection between the former and the latter may be made by taking their advantages and disadvantages into consideration.

A method for relatively successfully combining the features of the both styles is to employ a vertical deposition chamber. By utilizing the vertical chamber structure, it is possible to realize a structure that is less susceptible to deposition of foreign objects such as powder than the horizontal deposit-down style and allows even thermal distribution all over the substrate to be achieved more easily than in the horizontal deposit-up style.

<Film>

By the Cat-PECVD method according to the present invention, it is possible to form high-quality films at high deposition rate over large area with high uniformity in both thickness and quality. However, more specifically, the advantageous-effect of the present invention is exerted particularly significantly on Si-based films and C-based films as described as follows:

(1) A first example is a Si-based film formed by the use of a material-based gas which comprises a gas whose molecular formula includes Si and excludes a gas whose molecular formula includes C, and a non-Si non-C-based gas which comprises $H_2$. Specifically, for example, by using $SiH_4$ as the material-based gas and $H_2$ as the non-Si non-C-based gas, because of the aforementioned reason, high quality hydrogenated amorphous silicon films and crystalline silicon films including micro-crystalline, mono-crystalline and poly-crystalline silicons films can be formed over large area at high deposition rate with high uniformity in film thickness and quality.

(2) A second example is a Si-C-based film formed by the use of a material-based gas comprising a gas whose molecular formula includes Si and a gas whose molecular formula includes C, and a non-Si non-C-based gas comprising $H_2$. Specifically, for example, by using $SiH_4$ and $CH_4$ as the material-based gas and $H_2$ as the non-Si non-C-based gas, because of the aforementioned reason, high-quality hydrogenated amorphous silicon carbide films and crystalline silicon carbide films can be formed over large area at high deposition rate with high uniformity in film thickness and quality.

(3) A third example is a Si-N-based film formed by the use of a material-based gas comprising a gas whose molecular formula includes Si, a non-Si non-C-based gas comprising $H_2$, and a gas whose molecular formula includes N which is included at least in either of the material-based gas and non-Si non-C-based gas. Specifically, for example, by using $SiH_4$ as the material-based gas, $H_2$ as the non-Si non-C-based gas, and $NH_3$ as the gas comprising N, because of the aforementioned reason, high quality hydrogenated amorphous silicon nitride films and crystalline silicon nitride films can be formed over large area at high deposition rate with high uniformity in film thickness and quality.

(4) A fourth example is a Si—O-based film formed by the use of a material-based gas comprising a gas whose molecular formula includes Si and a non-Si non-C-based gas comprising $O_2$. Specifically, for example, by using $SiH_4$ and, if necessary, $H_2$ as the material-based gas, and $O_2$ and, if necessary, He and Ar as the non-Si non-C-based gas, because of the aforementioned reason, high-quality amorphous silicon oxide films and crystalline silicon oxide films can be formed over large area at high deposition rate with high uniformity in film thickness and quality.

(5) A fifth example is a Si—Ge-based film formed by the use of a material-based gas comprising a gas whose molecular formula includes Si and a gas whose molecular formula includes Ge, and a non-Si non-C-based gas comprising $H_2$. Specifically, for example, by using $SiH_4$ and $GeH_4$ as the material-based gas, and $H_2$ as the non-Si non-C-based gas, because of the aforementioned reason, high quality hydrogenated amorphous silicon germanium films and crystalline silicon germanium films can be formed over large area at high deposition rate with high uniformity in film thickness and quality.

(6) A sixth example is a C-based film formed by the use of a material-based gas comprising a gas whose molecular formula includes C and a non-Si non-C-based gas comprising $H_2$. Specifically, for example, by using $CH_4$ and, if necessary, small amount of $O_2$ as the material-based gas, and $H_2$ as the non-Si non-C-based gas, because of the aforementioned reason, high-quality amorphous carbon films and crystalline carbon films can be formed over large area at high deposition rate with high uniformity in film thickness and quality. Namely, diamond films and diamond-like carbon films can be formed.

<Device>

By the use of the films formed by the Cat-PECVD method according to the present invention, it is possible to manufacture the devices recited below with high performance and at low cost.

(1) A first example of device is a photoelectric conversion device, which can be manufactured with high performance characteristics at high speed, in other words, at low cost, by the use of a film formed by the Cat-PECVD method according to the present invention for a photoactive layer. In particular, the high-deposition rate, high-quality and large-area film formation characteristics of the Cat-PECVD method according to the present invention can be exhibited sufficiently in solar cells, the typical of photoelectric conversion devices. Thin-film solar cells with high efficiency can therefore be manufactured at low cost. It is needless to add that the same effect can be achieved in devices other than solar cells including photodiodes, image sensors and X-ray panels that have a photoelectric conversion function.

(2) A second example of device is a photoreceptor device, which can be manufactured with high performance characteristics at high speed, in other words, at low cost, by the use of a film formed by the Cat-PECVD method according to the present invention for a photoreceptor layer. In particular, the film is effectively used as a silicon-based film in photosensitive drums.

(3) A third example of device is a display device, which can be manufactured with high properties at high speed, in other words, at low cost, by the use of a film formed by the Cat-PECVD method according to the present invention for a driving layer. In particular, the film is effectively used as an amorphous silicon film or a polycrystalline silicon film in TFTS (thin film transistors). The same effect can be achieved in devices other than TFTs, including image sensors and X-ray panels that have a display function.

What is claimed is:

1. A Cat-PECVD method for depositing a film on a substrate comprising the steps of:

introducing a non-Si non-C-based gas comprising a gas whose molecular formula excludes Si and C into a first introduction channel;

heating the non-Si non-C-based gas introduced into the first introduction channel by a thermal catalysis body;

introducing a material-based gas comprising a gas whose molecular formula includes Si and/or C into a second introduction channel;

introducing the material-based gas and the non-Si non-C-based gas heated by the thermal catalysis body separately from each other into a film deposition space and through a common showerhead having a plurality of gas effusion ports; and forming a plasma space in the film deposition space by means of a nonplanar electrode connected to a radio frequency power supply, thereby depositing a film on the substrate.

2. The Cat-PECVD method according to claim 1, wherein the material-based gas and the heated non-Si non-C-based gas are blended together as they pass through the showerhead.

3. The Cat-PECVD method according to claim 1, wherein a part of the heated non-Si non-C-based gas is decomposed and activated and directed into the plasma space.

4. The Cat-PECVD method according to claim 1, wherein a doping gas is introduced into the second introduction channel or the first introduction channel.

* * * * *